(12) United States Patent
Littler et al.

(10) Patent No.: US 8,693,867 B2
(45) Date of Patent: Apr. 8, 2014

(54) METHODS AND SYSTEMS FOR FREQUENCY STABILISATION OF MULTIPLE LASERS

(75) Inventors: Ian C. M. Littler, Balmain (AU); Jong H. Chow, Ainslie (AU); Malcolm B. Gray, Pennant Hills (AU); David E. McClelland, O'Connor (AU)

(73) Assignee: The Australian National University, Acton, Australian Capital Territory (AU)

( * ) Notice: Subject to any disclaimer, the term of this patent is extended or adjusted under 35 U.S.C. 154(b) by 212 days.

(21) Appl. No.: 12/990,621

(22) PCT Filed: May 1, 2009

(86) PCT No.: PCT/AU2009/000547
§ 371 (c)(1),
(2), (4) Date: Jan. 18, 2011

(87) PCT Pub. No.: WO2009/132398
PCT Pub. Date: Nov. 5, 2009

(65) Prior Publication Data
US 2011/0122904 A1 May 26, 2011

(30) Foreign Application Priority Data

May 1, 2008 (AU) ............................ 2008902146

(51) Int. Cl.
*H04B 10/04* (2011.01)
*H01S 3/04* (2006.01)
*H01S 3/13* (2006.01)
*H04B 10/00* (2013.01)

(52) U.S. Cl.
USPC ............... 398/32; 398/16; 398/162; 398/196; 398/141; 398/188; 372/32; 372/29.02; 372/34; 372/29.023

(58) Field of Classification Search
USPC .......................................... 398/16, 32; 372/32
See application file for complete search history.

(56) References Cited

U.S. PATENT DOCUMENTS 4,856,009 A 8/1989 Hall et al.
5,936,565 A * 8/1999 Bogdan ......................... 341/152
(Continued)

OTHER PUBLICATIONS

Lasri, J., et al., "Frequency Locking at 50-GHz Spacings Using Optoelectronic Mixing in Photoheterojunction Bipolar Transistors," *IEEE Photonics Technology Letters*, vol. 11, No. 10, pp. 1298-1300, Oct. 1999.

(Continued)

*Primary Examiner* — Oommen Jacob
(74) *Attorney, Agent, or Firm* — Hamilton, Brook, Smith & Reynolds, P.C.

(57) ABSTRACT

A system and method for stabilizing a plurality of output frequencies (wavelengths) of a plurality of lasers (106). The laser beams are combined using optical multiplexer (110) and coupled into length-imbalanced (armlength-mismatched) Mach-Zehnder interferometer (MZI) (114) having an optical modulator (e.g. AOM) (122) in one of its arms. The output of the MZI is divided into corresponding beams via optical demultiplexer (128) and each beam is detected by a respective photo-diode (PD) (134). The individual electric signals, so generated, are demodulated using a corresponding plurality of phase-responsive devices (138) and the resulting phase-signals are directed to a plurality of servo-controllers (148) to control the central frequency of the respective lasers (106) via a corresponding plurality of feedback loop circuits (150). The lasers (106) can have different central frequencies which can also be individually tunned using offset modules (141) in the phase-responsive devices (138).

33 Claims, 8 Drawing Sheets

(56) References Cited

U.S. PATENT DOCUMENTS

| | | | |
|---|---|---|---|
| 6,034,976 A | | 3/2000 | Mossberg et al. |
| 6,370,169 B1* | | 4/2002 | Imajuku et al. ............... 372/32 |
| 6,493,125 B1* | | 12/2002 | Tanaka et al. ............... 398/95 |
| 6,501,773 B1 | | 12/2002 | Volz et al. |
| 7,068,949 B2 | | 6/2006 | Jung et al. |
| 2002/0048063 A1* | | 4/2002 | Jung et al. ............... 359/124 |
| 2003/0198476 A1* | | 10/2003 | Ohya et al. ............... 398/141 |

OTHER PUBLICATIONS

International Search Report for PCT/AU2009/000547, date of mailing Jul. 7, 2009.

International Preliminary Report of Patentability for PCT/AU2009/000547, date of mailing Aug. 13, 2010.

"The Optical Oilfield—Fibre Optic Seismic for Permanent Seabed Reservoir Monitoring," Business Briefing: Exploration and Production: The Oil and Gas Review vol. 2 (2003). http://www.touchoilandgas.com/optical-oilfield-fibre-optic-a222-1.html.

G. A. Cranch, C. K. Kirkendall, K. Daley, S. Motley, A. Bautista, J. Salzano, P. J. Nash, J. Latchem, and R. Crickmore, "Large-scale remotely pumped and interrogated fiber-optic interferometric sensor array," IEEE Photon. Technol. Lett. 15(11), 1579-1581 (2003).

E. Ronnekleiv, O. H. Waagaard, D. Thingbo, and S. Forbord, "Suppression of Rayleigh Scattering Noise in a TDM Multiplexed Interferometric Sensor System," Conference on Optical Fiber communication/National Fiber Optic Engineers Conference, 2008. OFC/NFOEC 2008. 1-3, Feb. 24-28, 2008. URL: http://ieeexplore.ieee.org/stamp/stamp.jsp?arnumber=4528405&isnumber=4528018.

D. J. Hill, P. J. Nash, D. A. Jackson, D. J. Webb, S. F. O'Neill, I. Bennion, and L. Zhang, "A fiber laser hydrophone array," in Proc. SPIE Conf. Fiber Optic Sensor Technology and Applications Boston, MA, 3860, 55-66 (1999).

S. Foster, A. Tikhomirov, M. Milnes, J. van Velzen, and G. Hardy, "A fiber laser hydrophone," Proc. SPIE 5855, 627-630 (2003).

R. W. P. Dreyer, J. L. Hall, F. V. Kowalsky, J. Hough, G. M. Ford, A. J. Munley, and H. Ward, "Laser phase and frequency stabilization using an optical resonator," Appl. Phys. B 31(2), 97-105 (1983).

J. H. Chow, I. C. M. Littler, G. de Vine, D. E. McClelland, and M. B. Gray, "Phase-sensitive interrogation of fiber Bragg grating resonators for sensing applications," J. Lightwave Technol. 23(5), 1881-1889 (2005).

J. H. Chow, D. E. McClelland, M. B. Gray, and I. C. Littler, "Demonstration of a passive subpicostrain fiber strain sensor," Opt. Lett. 30(15), 1923-1925 (2005).

J. H. Chow, I. C. Littler, D. E. McClelland, and M. B. Gray, "Laser frequency-noise-limited ultrahigh resolution remote fiber sensing," Opt. Express 14(11), 4617-4624 (2006), http://www.opticsinfobase.org/abstract.cfm?URI—oe-14-11-4617.

D. Shaddock, B. Ware, P. G. Halverson, R. E. Spero, and B. Klipstein, "Overview of the LISA Phasemeter," AIP Conf. Proc. Laser Interferometer Space Antenna: 6th International LISA Symposium, Nov. 29, 2006, 873, 654-660 (2006).

C. Greiner, B. Boggs, T. Wang, and T. W. Mossberg, "Laser frequency stabilization by means of optical self-heterodyne beat-frequency control," Opt. Lett. 23(16), 1280-1282 (1998), http://www.opticsinfobase.org/abstract.cfm?URI=ol-23-16-1280.

J. H. Chow, J. S. Cumpston, I. C. M. Littler, D. E. McClelland, and M. B. Gray, "Interrogation of a passive fiber Bragg grating resonator sensor by current modulation of a diode laser," Lasers and Electro-Optics Society, 2005. LEOS 2005. The 18th Annual Meeting of the IEEE, 818-819, Oct. 22-28, 2005. http://ieeexplore.ieee.org/stamp/stamp.jsp?arnumber=1548251&isnumber=33016.

B. Lissak, A. Arie, and M. Tur, "Highly sensitive dynamic strain measurements by locking lasers in fiber Bragg gratings," Opt. Lett. 23(24), 1930-1932 (1998).

D. S. Elliott, R. Roy, and S. J. Smith, "Extracavity laser bandshape and bandwidth modification," Phys. Rev. A 26(1), 12-18 (1982).

T.-C. Zhang, J.-Ph. Poizat, P. Grelu, J.-F. Roch, P. Grangier, F. Marin, A. Bramati, V. Jost, M. D. Levenson, and E. Giacobino, "Quantum noise of free-running and externally-stabilized laser diodes," Quantum Semiclassic. Opt. 7(4), 601-613 (1995).

D. Kersey, M. A. Davis, H. J. Patrick, M. LeBlanc, K. P. Koo, C. G. Askins, M. A. Putnam, and E. J. Friebele, "Fiber grating sensors," J. Lightwave Technol. 15(8), 1442-1463 (1997).

K. H. Wanser, "Fundamental phase noise limit in optical fibres due to temperature fluctuations," Electron. Lett. 28(1), 53-54 (1992).

Littler, Ian C. M., et al., "Pico-Strain Multiplexed Fiber Optic Sensor Array Operating Down to Infra-Sonic Frequencies," Optics Express, vol. 17, No. 13, 11077-11087, Jun. 22, 2009.

\* cited by examiner

METHODS AND SYSTEMS FOR FREQUENCY STABILISATION OF MULTIPLE LASERS

This application is the U.S. National Stage of International Application No. PCT/AU2009/000547, filed May 1, 2009, which designates the U.S., published in English, and claims priority under 35 U.S.C. §§119 or 365(c) to Australian Application No. 2008902146, filed May 1, 2008.

FIELD

The described embodiments relate to methods and systems for frequency stabilisation of multiple lasers.

BACKGROUND

In some laser stabilisation systems, fluctuations in the laser's central optical frequency are determined and counteracted using a reference interferometer (which acts as a frequency reference, with one or more reference frequencies). Laser tuning is achieved by tuning the interferometer's reference frequency. While this is adequate for a single laser source, multiplexing many lasers to their own frequency reference and concurrently providing independent tunability of each laser is inconvenient and costly.

It is desired to address or ameliorate one or more disadvantages or limitations associated with existing frequency stabilisation systems for lasers, or to at least provide a useful alternative.

SUMMARY

In accordance with the present invention, there is provided a method for stabilising a plurality of output frequencies of a corresponding plurality of laser beams, having different central frequencies, including:
  directing the plurality of laser beams into an optical frequency to radio-frequency phase converter that defines a shared frequency reference;
  generating, using the converter, a plurality of optical output signals corresponding to the plurality of laser beams and representative of frequency fluctuations between the respective central frequencies and the shared frequency reference;
  generating a plurality of electrical output signals, corresponding to the plurality of laser beams, using the plurality of optical signals;
  determining a plurality of radio-frequency phases corresponding the plurality of electrical output signals;
  generating from the determined plurality of radio-frequency phases a corresponding plurality of feedback signals indicative of the respective frequency fluctuations; and
  directing the feedback signals to a corresponding plurality of wavelength controllers of the laser beams to reduce the frequency fluctuations of the laser beams.

The present invention also provides a system for stabilising a plurality of output frequencies of a corresponding plurality of laser beams, having different central frequencies, including:
  an optical frequency to radio-frequency phase converter that defines a shared frequency reference, for generating a plurality of optical output signals corresponding to the plurality of laser beams and representative of frequency fluctuations between the respective central frequencies and the shared frequency reference;
  a plurality of photodetectors for generating a plurality of electrical output signals, corresponding to the plurality of laser beams, using the plurality of optical signals;
  a plurality of phase-responsive devices for generating, from a plurality of radio-frequency phases of the electrical output signals, a corresponding plurality of feedback signals indicative of the respective frequency fluctuations; and
  a plurality of feedback circuits for directing the feedback signals to a corresponding plurality of wavelength controllers of the laser beams to reduce the frequency fluctuations of the laser beams.

The present invention also provides a system for frequency stabilisation of a plurality of lasers, including:
  an optical-frequency-to-radio-frequency-phase converter, that defines a shared frequency reference, for generating a plurality of radio-frequency (RF) signals representative of frequency fluctuations of the respective lasers;
  a corresponding plurality of phase-responsive devices for generating phase signals from the RF signals; and
  a corresponding plurality of feedback loops for controlling the respective frequencies of the lasers, using the phase signals, to reduce the frequency fluctuations.

The present invention also provides a method for frequency stabilisation of a plurality of lasers, including:
  generating a corresponding plurality of radio-frequency (RF) signals representative of frequency fluctuations in the respective lasers using a shared frequency reference;
  generating a corresponding plurality of phase signals from the RF signals; and
  controlling the respective frequencies of the lasers, using the phase signals, to reduce the frequency fluctuations.

BRIEF DESCRIPTION OF THE DRAWINGS

Embodiments are hereinafter described, by way of example only, with reference to the accompanying drawings, which are not to scale, wherein.

DETAILED DESCRIPTION

Figure 1:
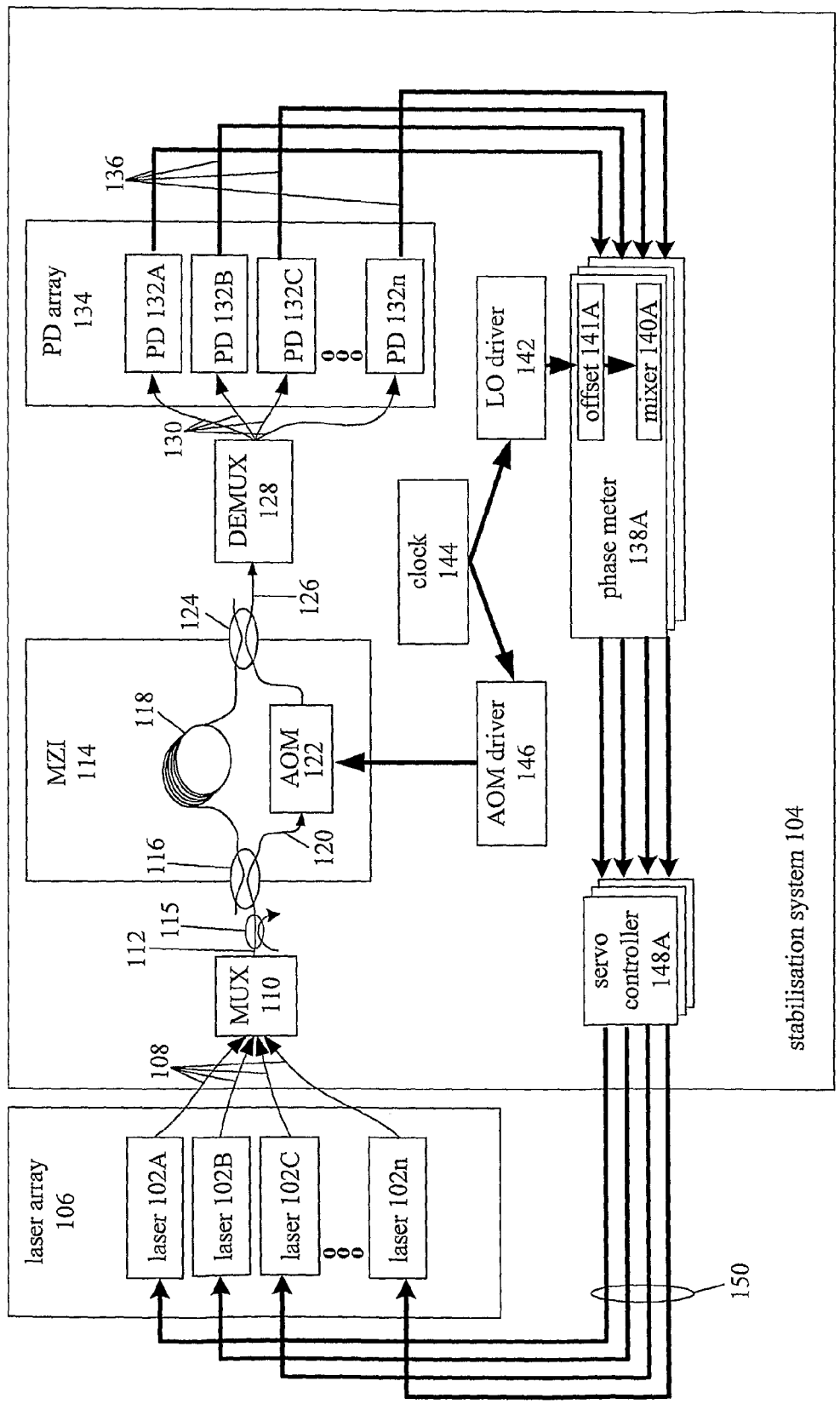
FIG. 1 is a schematic diagram of a laser system including a stabilisation system.

A stabilised laser system 100, shown in FIG. 1, includes a plurality of lasers 102 each generating an optical beam with a characteristic central optical frequency (or wavelength), a wavelength tuning and stabilisation system 104 for concurrently, or simultaneously, stabilising (or "suppressing") fluctuations in the characteristic central frequencies of the lasers 102, while still providing tuning control of these central frequencies. The stabilisation provides a reduction in the frequency noise of the lasers 102 down to infrasonic frequencies, e.g. down to less than about 1 Hz.

System Components

In the stabilised laser system 100, the lasers 102 are arranged in a laser array 106, and each laser 102 is coupled to the stabilisation system 104 using a single-mode optical fibre 108. The lasers 102 include a plurality of lasers referred to as laser 102A, laser 102B, laser 102C, etc., which form the laser array 106. (In this description, the numeral '102' may refer to one or more of the lasers 102 in the array, whereas the alphanumeric indices 102A, 102B, etc refer to only one of the plurality of lasers 102.) The optical fibres 108 from the laser array 106 are connected to an optical multiplexer (MUX) 110 which multiplexes the component optical beams from the lasers 102, each tuned to a multiplexer channel, into a single-mode optical input fibre 112. The central frequencies of the lasers 102 are selected to correspond to the multiplexer channels, which are selected to be as close as possible while still providing negligible optical cross-talk between the channels and sufficient channel passband for any sensors associated with the channels, e.g. based on frequency sidelobes of Fabry-Perot interferometers used as sensors in an array sensing application (described as an example with reference to FIG. 9 below), and any drift or change of the interferometer frequency based on environmental changes (due to temperature).

Most of the light of the combined beams is coupled out by an optical coupler 115 for laser applications, e.g. interrogating optical sensors, further described below. Some of the light of the multiplexed beams is directed by the input fibre 112 into a length-imbalanced (or "armlength-mismatched") interferometer in the form of a heterodyned Mach-Zehnder Interferometer (MZI) 114, and used for stabilising the lasers 102.

The MZI 114 includes an input coupler 116 for beam splitting, a long path-length arm 118, a short path-length arm 120 which includes an acousto optic modulator (AOM) 122, and an output coupler 124 for beam recombination. (In alternative embodiments, the AOM 122 is in the long path-length arm 118.) Each component beam of the multiplexed beams in the input fibre 112 is separated by the input coupler 116 into a long-arm portion and a short-arm portion, which are of substantially equal optical power. The short-arm portion of each component beam is frequency-shifted by the AOM 122. (In alternative embodiments, the AOM 122 frequency modulates the long-arm portion of each beam.) The AOM 122 is driven by an AOM driver 146 at modulation frequency $F_{AOM}$, using a clock frequency signal from an electronic clock 144 (e.g. a clock defined as a component of a field-programmable gate array (FPGA) chip that defines a fundamental loop rate that is used to generate digital sinusoidal signals at frequencies tied to the loop rate, each sinusoidal signal being defined based on a corresponding phase ramp driving a sinusoidal look-up table within the loop).

The long-arm portion and the modulated short-arm portion of each beam are recombined in the output coupler 124 and directed, via a single-mode output fibre 126, to an optical demultiplexer (DEMUX) 128, which divides (or "splits") the multiplexed component beam portions into physically separated beams based on their wavelengths. The component beams are separated in wavelength space by their channel wavelengths, which correspond to the central wavelengths of the lasers 102. Each separated beam is directed by an optical fibre 130 to a photodetector (PD) 132, i.e. each PD 132 detects a beam from a corresponding laser 102 (e.g. the PD 132A detects the beam originally generated by the laser 102A; the PD 132B detects the beam originally generated by the laser 102B; etc). From the detected beams, the PDs 132 generate a plurality of PD signals that are directed, via electronic connectors 136, to a corresponding plurality of corresponding phase-responsive devices, referred to as phase meters 138. Each of the phase meters 138 (individually referred to as phase meter 138A, etc.) uses its own corresponding local oscillator (LO) signal at a local oscillator frequencies $F_{LO-A}$, $F_{LO-B}$ etc. The local oscillator frequency $F_{LO-A}$, $F_{LO-B}$ etc are generated by an LO driver 142 (e.g. a FPGA component that receives the clock signal) and a plurality of offset modules 141 (e.g. further FPGA components). The LO signals are used to demodulate corresponding PD signals, and thus generate a phase signal indicative of the phase difference between the PD signal and the corresponding LO signal. The LO signal is based on the clock signal from the electronic clock 144.

Changes in the phase signals from each phase meter 138 are proportional to changes in the central optical frequencies of the corresponding lasers 102. The phase signals are received by a plurality of servo controllers 148 (referred to as servo controller 148A, etc.) which generate, from the determined phases, a corresponding plurality of feedback signals, i.e. one for each laser 102A, 102B, 102C, etc, representative of fluctuations in the central frequencies of each corresponding laser 102A, 102B, 102C, etc. The feedback signals are directed to laser wavelength controllers of the lasers 102 (e.g. to central tuning controllers corresponding to the lasers 102) via a plurality of feedback circuits 150 (e.g. using digital or analogue electronics appropriate for the wavelength controllers). This negative feedback acts to reduce the frequency fluctuations of the respective lasers 102.

The local oscillator frequency of each phase meter 138 is offset from the AOM frequency by an offset frequency generated in each corresponding offset module 141. The offset causes the corresponding outputs of the phase meters 138 to change allowing the lasers 102 to be tuned, as described hereinafter.

System Operation: Frequency Noise Suppression

Laser and Feedback Loop

In operation, each laser 102 has its central output frequency $v_{laser}$ controlled by a laser drive signal (e.g. the current injected into a laser diode) from the laser's wavelength controller. The stabilisation system 104 measures (or "determines") fluctuations in the output frequency $v_{laser}$ of each laser 102; these frequency fluctuations are known as the "frequency noise", or "phase noise", of each laser 102. The measurements of frequency noise are made with reference to one of a multitude of reference frequencies $F_R$, defined by the interferometer (i.e. MZI 114), the modulator (i.e. the AOM 122) and the demodulators (i.e. within the phase meters 138). The plurality of reference frequencies $F_R$ provide a common, or shared, frequency reference for the plurality of lasers 102. A negative feedback loop for each laser 102, each with one of the servo controllers 148, corrects the laser drive signals from the wavelength controller of each laser 102 by an amount compensating for the frequency noise, thereby stabilising the output frequency of each laser 102, at least within an operational bandwidth and gain of the stabilisation system 104. If the path length difference in the MZI 114 and the AOM 122 are substantially invariant, so is the laser frequency of each laser 102 within the gain and bandwidth of the feedback loop.

Discriminator

Figure 2:
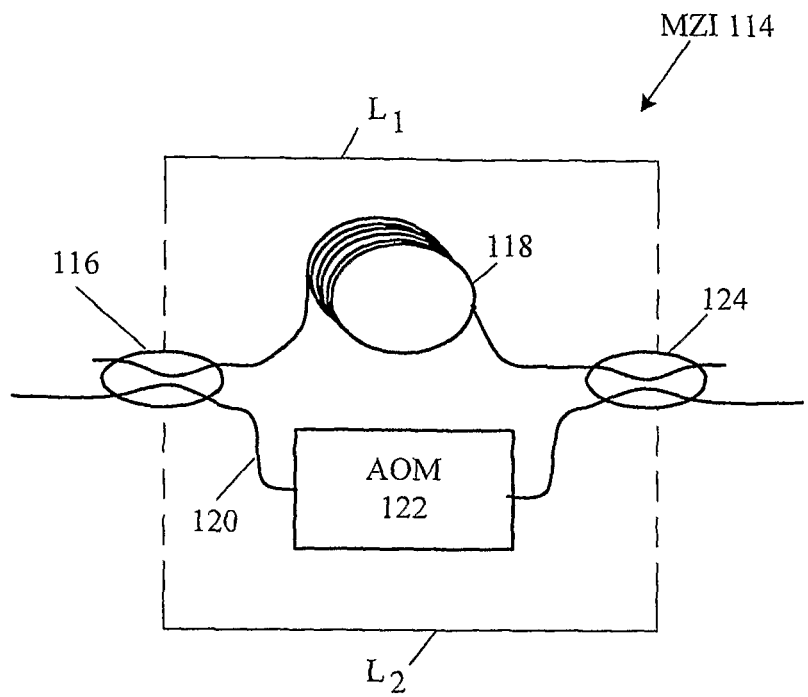
FIG. 2 is a schematic diagram of an interferometer in the stabilisation system.

The MZI 114 is a form of "discriminator", or an optical frequency-to-radio-frequency (RF) phase conversion device, or equivalently an optical wavelength-to-RF phase conversion device, which generates an output RF signal with a phase that is indicative of the optical frequency of an input light beam. A change in optical frequency generates a corresponding change in RF phase. For example, the phase of the RF output signal fluctuates based on fluctuations in the central frequency of the input light beam from a corresponding laser 102. The frequency-to-RF-phase conversion in the MZI 114 is an effect caused by modulation of the AOM 122 and having two arm lengths ($L_1$ and $L_2$) of unequal optical length, as indicated approximately in FIG. 2, and thus having an optical path difference $n\Delta L$, which is proportional to both the effective refractive index (n) of the waveguide or fibre arms (including the AOM 122) in the MZI 114, and the difference between the arm lengths ($L_1-L_2$), i.e. $n\Delta L=n(L_1-L_2)$.

If the frequency shift generated by the AOM 122 is zero (for the purpose of explanation only), then the optical path difference $n\Delta L$ causes the interference signal at the output of the MZI 114 to be sinusoidally dependent on the optical frequency of the beams. This sinusoidal dependence has an interferometer period $\Delta v_{MZ}$ in frequency space, which is related to the optical path difference by $\Delta v_{MZ}=c/n\Delta L$. Depending on the frequency of the laser, the output of the interferometer will be somewhere between a dark and light fringe, i.e. at some phase of the sinusoidal output of the interferometer. When the input laser frequency changes by a frequency shift $\delta v_{laser}$ the resulting phase change, $\delta\phi$ (in radians) at the output of the interferometer due to the length mismatch of the interferometer is proportional to the frequency shift $\delta v_{laser}$ and inversely proportional to the interferometer period $\Delta v_{MZ}$, i.e. $\delta\phi=2\pi\delta v_{laser}/\Delta v_{MZ}$.

If the RF frequency shift of the AOM 122 is non-zero, the phase change $\delta\phi$ is translated (or "carried") onto an RF carrier signal (i.e. the phase change $\delta\phi$ is also proportional to the RF modulation of the AOM 122), allowing the full phase information to be extracted during demodulation. Without the AOM frequency shift, i.e. in a baseband measurement where the AOM frequency shift is zero, any quadrature information is lost due to signal fading at turn-around points in the interferometer output, and individual tuning of the lasers 102 (via the feedback loops) is not be possible or is at least less convenient.

The arm mismatch length $\Delta L$ (also referred to as the length imbalance) defines the sensitivity of the phase change $\delta\phi$ to the frequency change of the laser, as shown in the following equation:

$$I_{beat}(t) \propto E_0(t)E_0\left(t-\frac{n\Delta L}{c}\right)\times\cos\left\{2\pi\left[\int_{t-\frac{n\Delta L}{c}}^{t} v(t')dt' + F_{AOM}t + \phi\right]\right\}, \quad (1)$$

where $E_0$ is the real valued amplitude of the electric field in each arm, $v$ is the instantaneous frequency of the light, $F_{AOM}$ is the frequency of the AOM modulation, and $\phi$ is a initial or start phase of the AOM 122. The term $n\Delta L/c$, where $n\Delta L$ is the optical path difference with n the refractive index and c the speed of light, gives the time delay introduced by the path length imbalance.

The arm mismatch length $\Delta L$ (and thus the optical path difference $n\Delta L$) is generally chosen so that the interferometer period $\Delta v_{MZ}$ (i.e. the periodicity of frequency variation) is substantially greater than the free-running linewidth of any laser 102, e.g. at least four times greater, or 10 times greater. For example, with a free-running laser linewidth of about 1 MHz, a length mismatch $\Delta L$ of 20 m is chosen, which gives a value for interferometer period $\Delta v_{MZ}$ of about 10 MHz. In general, the mismatch length $\Delta L$ between the two arm lengths, $L_1$ and $L_2$, is selected to be between 1 and 20 meters, and thus the interferometer period $\Delta v_{MZ}$ is selected to be between about 200 MHz and 10 MHz.

Modulator

Figure 3:
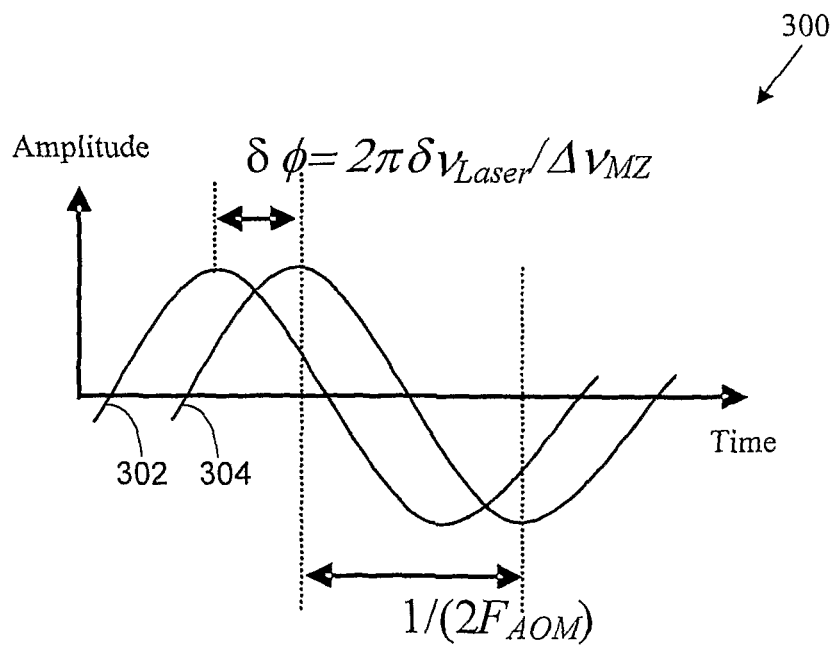
FIG. 3 is a graph of signal amplitude at an output of the interferometer.

The AOM 122 provides modulation that is used to extract (or "determine") quadrature information from the output of the MZI 114, thus allowing precise measurement of the output frequency of each laser 102. The AOM 122 modulates the portion of the beam that is in the short arm of the MZI 114 at a modulation frequency $F_{AOM}$, which causes an optical "beat note" (at a "beat frequency" or "difference frequency") to be formed at the output of the MZI 114 for each laser 102. The phase of the optical beat note depends on the absolute laser frequency $v_{laser}$ of the laser 102 and the length mismatch $\Delta L$ of the MZI 114. Phase changes $\delta\phi$ (in radians) of the beat note are proportional due to laser frequency changes $\delta v_{Laser}$ (in Hz), i.e. $\delta\phi=2\pi\delta v_{Laser}/\Delta v_{MZ}$, as shown in FIG. 3, where the sinusoidal amplitude signals of the first arm and the second arm 302, 304 are shown having about equal amplitude, equal wavelength of $1/(2F_{AOM})$ and a phase difference of $\delta\phi$. The optical output signal of the MZI 114 for each laser 102 includes an RF modulation of the amplitude (or "intensity") of output optical beam, oscillating at the modulation frequency $F_{AOM}$ determined by the AOM 122, with an RF phase $\phi$ which has phase changes $\delta\phi$ representative of the laser's frequency changes $\delta v_{Laser}$.

The modulation frequency $F_{AOM}$ of the AOM 122, and thus the frequency of the beat note, is typically selected to be in the range accessible by AOMs, i.e. 10 MHz to 200 MHz. In an example stabilisation system 104, the modulation frequency was $F_{AOM}=29$ MHz, because the lasers were RF modulated at still higher frequencies for use in a laser application of interrogating a sensor array (via the optical coupler 115). A sufficient difference between the AOM frequency and any further modulation frequencies (selected depending on the application) is preferred to allow selection of only the AOM frequency $F_{AOM}$ in the phase meters 138 (i.e. other modulation frequencies can be filtered out and thus have negligible effect for the phase meters 138).

Demodulator

The optical beat notes associated with the different central laser frequencies are separated by the DEMUX 128 and converted to electronic signals by the PDs 132. To extract the phase of each beat note, each beat signal is mixed with the corresponding local oscillator signal in the corresponding mixer 140.

Each mixer 140 (of mixers 140A, 140B, etc) operates at a frequency that is based on signals from both the shared corresponding LO driver 142 and the corresponding offset 141. In particular, the frequency of the each mixer 140 is defined by the sum (or difference) of the frequencies of the LO driver 142 (which is approximately equal to the frequencies of the clock 144 and thus the AOM signal) and the corresponding offset 141A.

The same clock signal drives both the AOM ($F_{AOM}$) and Local Oscillator ($F_{LO}$), which ensures a deterministic phase relationship between these two signals.

For stabilising each laser 102 at a constant output frequency $v_{laser}$, the corresponding local oscillator signal, at $F_{LO}$, is selected to be equal in frequency to the AOM modulation signal at $F_{AOM}$. For tuning each laser 102, as described below, the corresponding local oscillator signal is offset, using the corresponding offset signal, to have a frequency either higher or lower than the AOM modulation signal's frequency $F_{AOM}$, as described below.

The output of each mixer 140 is proportional to the instantaneous phase $\phi$ of the corresponding beat note. The instantaneous phase measurement from each mixer 140 is fed (or "communicated") to each corresponding servo controller 148. The servo controllers 148 provide amplification and integration of the feedback signal to each laser 102, and these feedback signals suppress the phase/frequency noise of the lasers 102, thus stabilising the laser's output frequency $v_{laser}$.

Each phase meter 138 may be based on analogue or digital electronics. When implemented using digital electronics, fast analogue to digital converters (ADC's) are used to convert from the analogue to the digital domain before the phase meters 138, and fast digital to analogue converters (DAC's) are used to convert back to the analogue domain after the server controllers 148.

Figure 4:
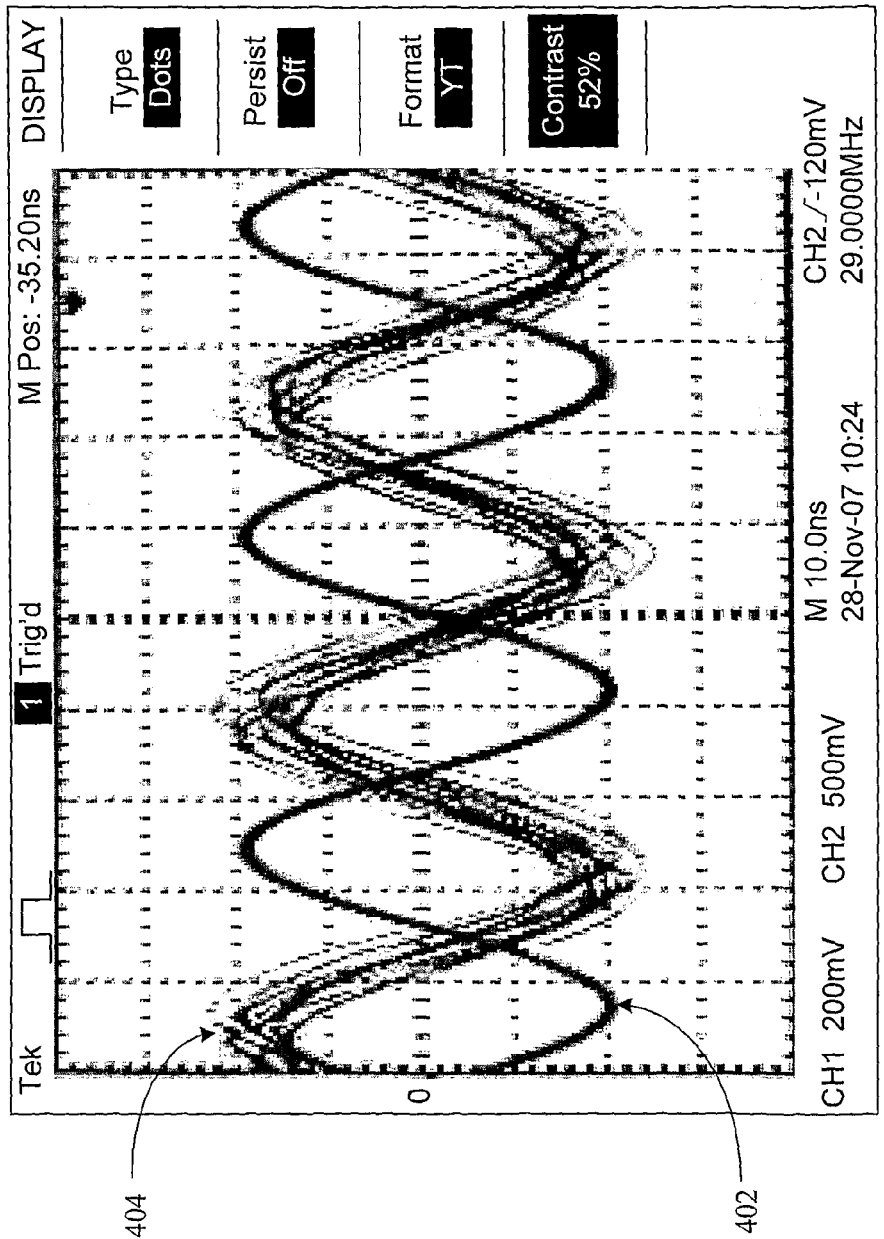
FIG. 4 is a plot of a measured modulation signal and a measured modulated output of the interferometer.

In an experiment, the RF modulation signal 402 was set at frequency $F_{AOM}$, (as shown in FIG. 4) with an example optical beat note 404 from the MZI 114 (i.e. the fuzzier trace in FIG. 4, indicative of laser frequency noise). The phase difference between the two traces in FIG. 4 was detected by one of the phase meters 138. When the corresponding feedback loop was closed (i.e. one of the servo controllers 148 was activated and the stabilisation system 104 became active), the noise (i.e. the fuzziness of the trace) of the beat note trace 404 decreased as the phase/frequency fluctuations of the corresponding laser 102 were suppressed.

Servo Controller

Figure 5:
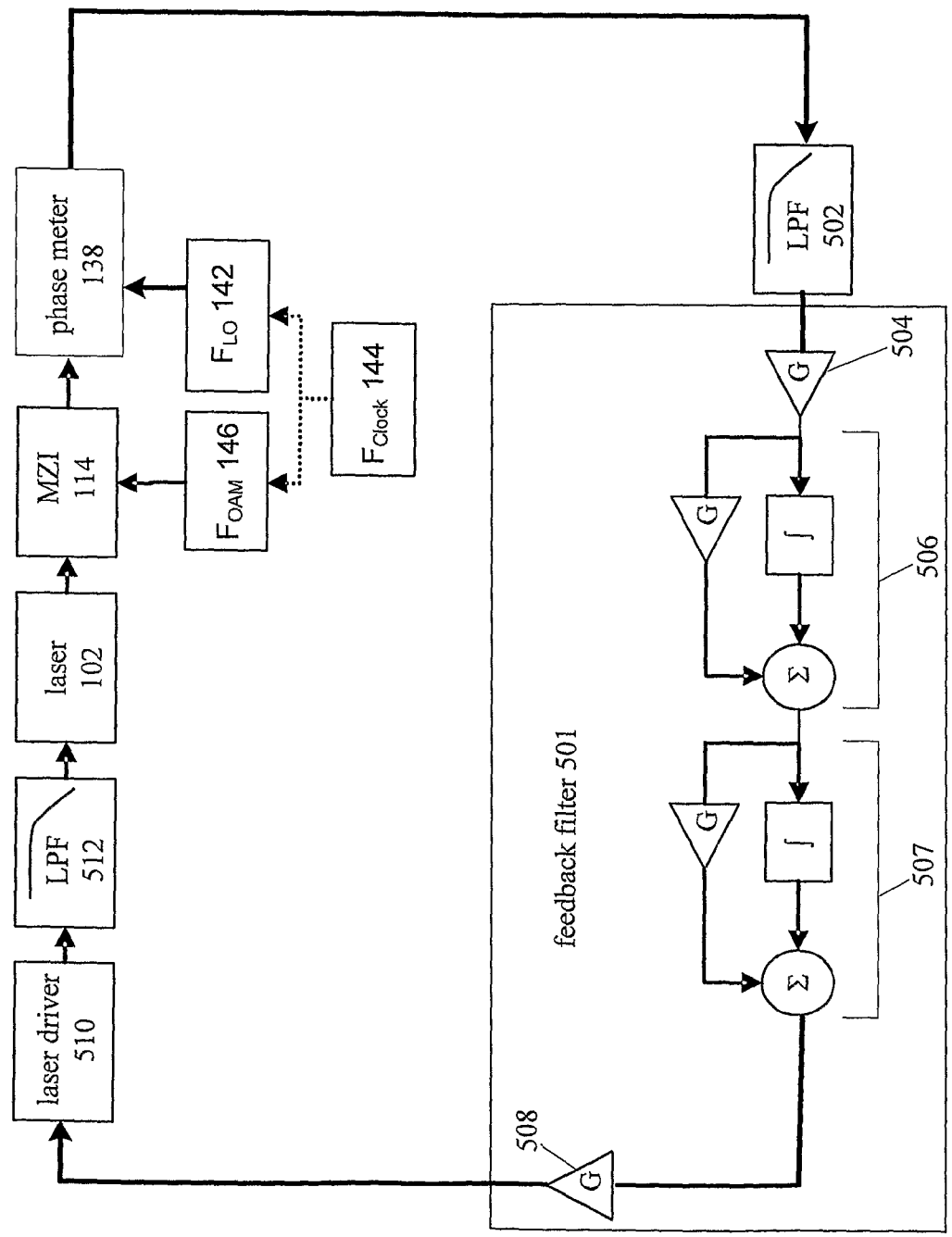
FIG. 5 is block diagram of the laser system, including a feedback filter of the stabilisation system.

Each servo controller 148 is used to suppress laser phase/frequency fluctuations and to tune its corresponding laser 102. Each servo controller 148 includes a conditioning low pass filter (LPF) 502, a feedback filter 501, and a driver low pass filter (LPF) 512, as shown in FIG. 5.

Each feedback filter 501 includes a servo circuit which may be either analogue, or digital. For a digital feedback filter 501, analogue-to-digital (ADC) and digital-to-analogue converters (DACs) are used to convert signals from the analogue to the digital domain and back again. Each ADC receives analogue signals from its corresponding photodetector 132, and sends a digitised signal to its corresponding phase meter 138A. The filtered phase signal from a conditioning LPF 502 is sent to sequential Proportional-Integral (PI) units 506, 507 of the feedback filter 501 which determine a frequency response of each servo controller 148. Each conditioning LPF 502 limits the bandwidth of the phase-indicative signal from each phase meter 138 to match the loop rate of the digital feedback filters (e.g. typically <1 MHz), and to match the bandwidth of the output of the phase meter to the bandwidth of the PI units 506, 507 and the DAC. A selectable level of signal gain in the feedback loop is provided by amplifiers 504 and 508 respectively arranged to provide gain before and after the PI units 506, 507. Each DAC receives digital signals from its corresponding PI units 506, 507, and sends analogue signals to its corresponding laser driver 510. The analogue laser driver output LPF 512 ensures appropriate roll-off towards each laser's unity gain frequency, thus avoiding unstable servo behaviour. The driver LPF 512 provides a 1/F roll-off (i.e. frequency response) with a corner frequency at 10 Hz (i.e. is flat for lower frequencies). The additional filters (implemented using either analogue or digital circuits), provided by the integrator and bypass (PI) units 506, 507, are in series with the driver LPF 512 in each feedback loop to modify the filter response curve, and thus the response of the feedback loop. The first PI unit 506 has a 1/F roll-off to a corner frequency approximately equal to the corner frequency of the driver LPF 512 (e.g. 10 Hz), and is then flat for higher frequencies. The second PI unit 507 has a 1/f roll-off to a corner frequency of about 1 to 3 kHz (this corner frequency is selected to be about ten times less than the unity gain frequency, and then adjusted for maximum frequency noise suppression), and is then flat for higher frequencies. The amplifiers 504, 508 are arranged to provide gain in the feedback loop such that the unity gain frequency is approximately 30 kHz. The combined frequency response of the driver LPF 512 and the PI units 506, 507 has a $1/(F^2)$ roll-off to the corner frequency of the second PI unit 507 (e.g. about 1 to 3 kHz), and then a 1/F roll-off to the unity gain frequency (e.g. approximately 30 kHz). Combined with the gain amplifiers 504, 508 in the feedback loop, high gain is provided at low frequencies, while stability is provided by a 1/F roll-off around the unity gain frequency.

System Operation: Laser Tunability

Although the sinusoidal frequency response of an arm-mismatched interferometer may be used to lock a laser to discrete 'lock points' over its spectrum (e.g. using zero crossings which exist with the periodicity $\Delta v_{MZ}$ in the frequency response), this does not in general allow continuous independent tuning of a plurality of lasers 102 all locked to the same interferometer.

Using the stabilisation system 104, each laser 102 can be tuned individually and continuously by including an offset (in the offset 141) in the feedback signal transmitted to the laser 102, i.e. by offsetting $F_{LO}$ from $F_{AOM}$ for each channel (corresponding to each laser 102) of the electronic feedback loop. Offsetting $F_{LO}$ from $F_{AOM}$ by a set frequency introduces a phase ramp (i.e. a constantly increasing or decreasing phase delay) that the feedback loop attempts to cancel by tuning the laser frequency: the offset, or the phase ramp, is selected to be a certain offset value (which determines the rapidity of the frequency tuning) for a certain time period (which determines the total change in laser frequency). Once the desired laser frequency has been selected, $F_{LO}$ is again set to equal to $F_{AOM}$, causing the lock point to become stationary and the feedback loop to cease tuning. The laser frequency can be set arbitrarily within the tuning range of the laser 102.

During tuning, the PI units 506, 507 of the feedback filter 501 act as accumulators of RF phase. When $F_{LO}$ is detuned from $F_{AOM}$, the respective lasers 102 are tuned (i.e. their respective central frequencies are controlled). In offsetting the RF phase, a phase offset builds up which is 'remembered' (i.e. integrated) by the feedback system, which thus accumulates phase to maintain the new laser frequency.

The offset and total change in frequencies for each laser central frequency can be controlled (i.e. tuned) manually or by a further feedback and control loop (filter and controller) for tuning the central wavelength, as described below with reference to system applications and implementation.

By using the offset module 141 between $F_{LO}$ and $F_{AOM}$ to tune the laser 102, there is no limitation on the extent of tuning available, i.e. there is no dynamic range limitation on the tuning, at least within the tuning bandwidths of the laser 102 and the interferometer. The laser tuning range may be about 2% of the bandwidth of the interferometer.

The stabilisation system 104 stabilises each laser 102 to an arbitrary selectable reference frequency (selected or defined by the MZI 114), without needing to tune to a cavity or an atomic resonance.

System Operation: Multiplexed Lasers

The stabilisation system 104 can stabilise the plurality of lasers 102 to the same interferometer. The MZI 114, being a two-beam interferometer, has a broad wavelength response, which is as wide as the response of the optical couplers, and the AOM 122 (e.g. about 50 nm, or for a C-band coupler from about 1520 nm to about 1570 nm) and thus allows the plurality of lasers 102 to be simultaneously (or "concurrently") stabilized to the same interferometer.

System Operation: Stabilisation Method

Figure 6:
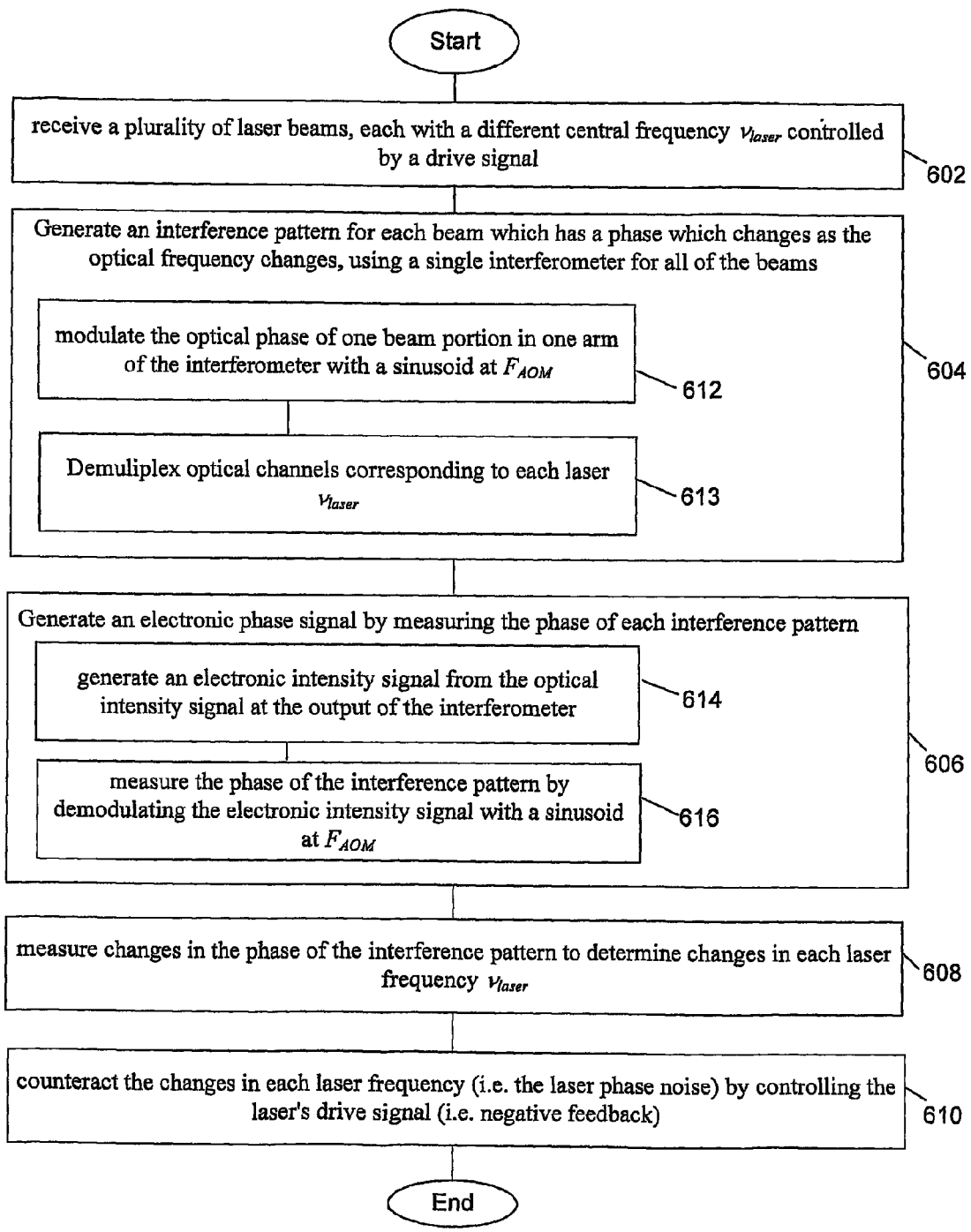
FIG. 6 is a flowchart of a method performed by the stabilisation system.

The stabilisation system 104 performs a method of laser stabilisation for each laser 102 as shown in FIG. 6, which commences with the stabilisation system 104 receiving a plurality of laser beams, along the optical fibres 108, each with a different central frequency $v_{laser}$ controlled by the laser drive signal (step 602). The stabilisation system 104 generates an interference pattern for each component beam, which has a phase which changes as the optical frequency $v_{laser}$ changes, using a single interferometer for all of the beams, i.e. MZI 114 (step 604). The baseband interference pattern is translated to the RF modulation frequency by shifting the frequency of one beam portion, of each beam, in one arm of the interferometer with a sinusoidal signal driving the AOM 122 at a frequency $F_{AOM}$ (step 612). After demultiplexing the component beams with information about each individual laser (using the DEMUX 128), the stabilisation system 104 generates an electronic phase signal by measuring the phase of each interference pattern using the PD array 134 and the phase meters 138 (step 606). The electronic phase signals are indicative of changes in the phase of the RF interference patterns, which the stabilisation system 104 uses to determine changes, or fluctuations, in each laser frequency $v_{laser}$ (step 608). The stabilisation system 104 counteracts the changes, or fluctuations, in each laser frequency (i.e. the laser phase noise) by controlling the laser's drive signal (i.e. in a negative feedback mode) using the servo controllers 148 (step 610).

Generating the electronic phase signal (step 606) is performed by generating an electronic intensity signal from the optical intensity signal at the output of the interferometer (step 614). The electronic intensity signal is an alternating current (AC), or oscillating, signal. The phase of the interference pattern is measured by demodulating the electronic intensity signal, delivered via the electronic connectors 136, with a sinusoid at the frequency $F_{LO}=F_{AOM}$, in each phase meter 138 (step 616).

The laser's frequency noise spectrum is locked to the MZI 114 within the gain and bandwidth of each feedback loop (including each servo controller 148A), but the low frequency component (i.e. including the actual central laser frequency) can be locked to another, selectable reference (e.g. a different molecular resonance for each laser), by providing slow feedback to the frequency offset between $F_{LO}$ and $F_{AOM}$ using the offset modules 141. The bandwidth of the slow feedback loop depends on the gain of the feedback provided and the bandwidth is typically a few Hz to allow each laser to follow slow drifts in the central wavelengths of sensors, for instance, due to temperature.

System Operation: Experiments

Figure 7:
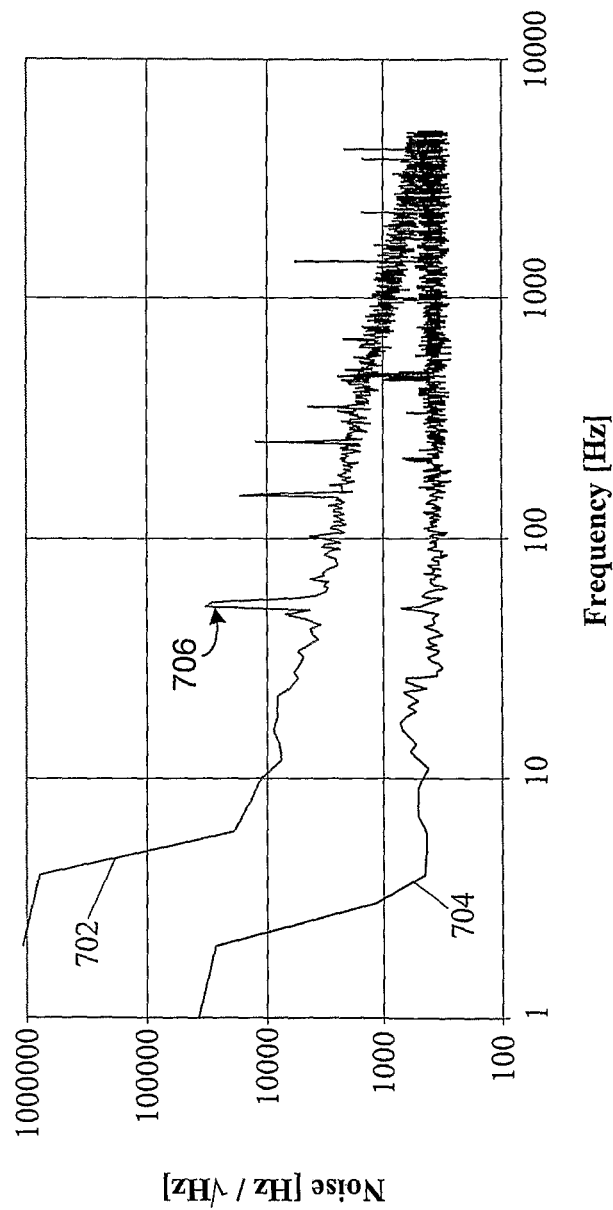
FIG. 7 is a plot of measured noise spectra in the laser system, showing a reduction in noise due to operation of the stabilisation system.

Experiments were conducted using the stabilisation system 104 with one of the plurality of lasers 102 in the form of a distributed feedback (DFB) diode laser, being a JDSU CQF 935/708 series DFB laser with a linewidth of less than 1 MHz. The free-running laser frequency noise of the DFB diode laser was reduced to about 400 Hz/$\sqrt{Hz}$ over a bandwidth of about 5 kHz (from 4 Hz), representing a noise suppression of over an order of magnitude at 10 Hz, as shown in FIG. 7. The stabilized noise floor is set by intrinsic laser noise which could not be compensated for by laser current injection.

Figure 8:
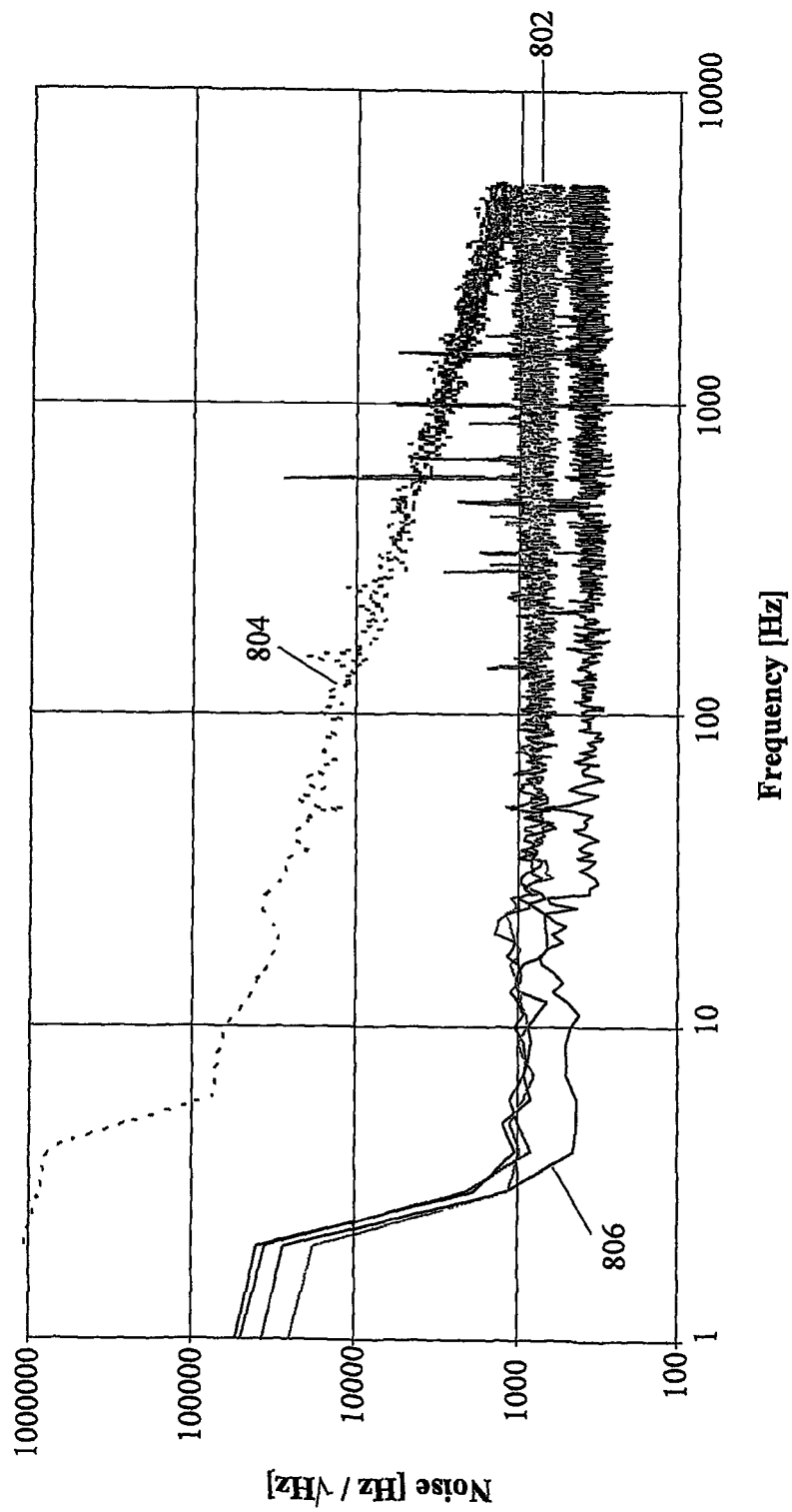
FIG. 8 is a plot of measured noise spectra in the laser system, showing a simultaneous reduction in noise in a plurality of lasers due to operation of the stabilisation system.

The noise suppression approached two orders of magnitude at 10 Hz for initially noisier lasers, as shown in FIG. 8. These measurements were made out-of-loop using an independent, calibrated and quiet frequency reference. The vertical axis is the spectral noise in units of Hz/$\sqrt{Hz}$, and the horizontal axis is the frequency from 1 Hz up to 5 kHz. The upper trace 702 shows the noise spectrum of the diode laser when it is free running. From 6 Hz upwards the noise follows roughly a 1/$\sqrt{F}$ dependence. At 10 Hz the noise is 10 kHz/$\sqrt{Hz}$, trailing off to 400 Hz/$\sqrt{Hz}$ at high frequency. The dominant peaks visible in the spectrum of the upper trace 702 are related to residual 50 Hz AC, and higher harmonics, on the current driving for the diode laser. The lower trace 704 shows the noise spectrum of the diode laser when the servo loop was closed, and the stabilisation system 104 suppressed the noise, including the AC peaks, down to a broadband noise floor level (400 Hz/$\sqrt{Hz}$), which was generally flat from about 4 Hz to 5 kHz. This broadband noise floor was determined by fundamental processes in the DFB diode laser itself. The broad resonance 706 at 20 Hz just above the broadband noise floor represents a mechanical vibration of a table-top resonance picked up by the out-of-loop reference used for the measurement, i.e. was not intrinsic to the stabilization process. The peak at 480 Hz probably represents a mechanical resonance in the mount used to hold the out-of-loop frequency reference (used to take the measurements), since it was able to be excited acoustically.

In an example multiplexed stabilisation system 104, four DFB fibre lasers with central frequencies separated by 100 GHz, were coupled simultaneously to a shared (or "common") MZI. Each laser 102 had an individual servo controller 148. The measured noise spectra, in FIG. 8, show that there was sufficient isolation between adjacent channels to achieve good suppression of the laser noise. The four DFB diode lasers were locked to the same MZI using optical fibre multiplexing equipment. Three of the diode lasers exhibited essentially the same flat noise floor at a level of ~800 Hz/$\sqrt{Hz}$, extending in a band from roughly 4 Hz to 5 kHz. A representative free running noise spectrum (shown as plot 804) for these three lasers is substantially greater than the locked noise floor spectrum (shown as plot 802). The fourth diode laser (from a different manufacturer and possibly different construction) was slightly quieter with a noise floor at 400 Hz/$\sqrt{Hz}$ (shown as plot 806). As shown by the plot 802 representing the noise spectra during operation of the multiplexed stabilisation system 104, the noise remaining when the stabilisation system is operating is independent of the number of lasers 102 which are locked to the MZI 114 at any one time.

System Applications and Implementation

The stabilisation system 104 can be used in laser applications based on an optical fibre system, incorporating optical fibre sensors connected via the coupler 115, such as arrays of all-optical hydrophones and geophones in seismic detection applications. For example, the optical coupler 115 may communicate with fibre sensors in a sensor system 900, as shown in FIG. 9.

Figure 9:
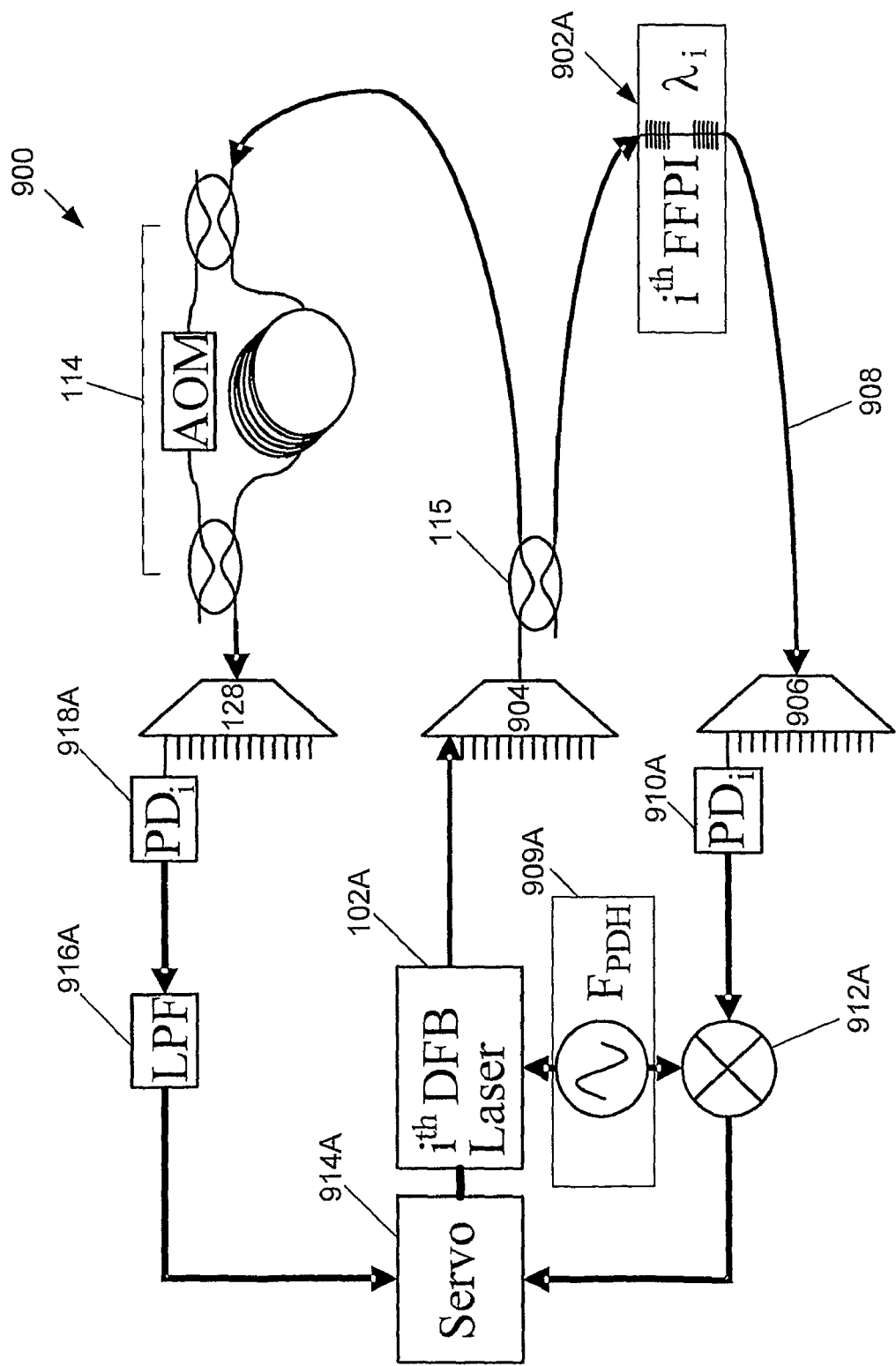
FIG. 9 is a schematic diagram of a sensor system including the stabilisation system.

The sensor system 900, as shown in FIG. 9, includes a plurality of lasers, including the "ith" laser 102A. Although only one channel, i.e. one laser 102A and one sensor 902A (with the "ith" FFPI), are shown in FIG. 9, the multiplexing components 128, 904, 906 provide for additional lasers (of lasers 102) and fibre channels to interrogate a corresponding plurality of sensors in series in a sensor fibre 908. The sensor array fibre is, for example, a long length of fibre with multiple sensors, where each sensor includes a fibre Fabry-Perot interferometer (FFPI) for responding to fibre strain via a suitable transducer on the ocean floor, e.g. for oil and gas exploration.

Most of the light from the laser 102A is used to lock the laser 102A to a Fabry-Perot mode of the corresponding FFPI-based sensor 902A, using a Pound-Drever-Hall (PDH)-based RF interrogation technique, e.g. as described in International Patent Application Publication No. WO/2007/045028 ("Apparatus for interferometric sensing" to The Australian National University). In PDH sensor interrogation, the laser beam is phase-modulated at a frequency $F_{PDH}$, based on a periodic signal with this frequency from a signal generator 909A. The corresponding FFPI sensor 902A creates a measure of its strain by converting the phase modulation of the laser beam into an amplitude modulation. The extent of this amplitude modulation is determined by a corresponding PDH photodetector 910A and mixer 912A. The PDH mixer 912A is driven at $F_{PDH}$ by the signal generator 909A. The output of the PDH mixer 912A provides an "error signal" used to determine the strain and to lock the laser 102A to its corresponding FFPI via a servo 914A. The servo 914A includes analogue circuitry and/or digital filtering to control the central frequency of its corresponding laser 102A.

Some of the light from the laser 102A is separated from the PDH beam by the coupler 115 and directed to the single frequency reference provided by the MZI 114, which performs the laser-frequency-to-RF-phase conversion. The frequency of the AOM 122 is selected to be smaller than the PDH modulation frequency $F_{PDH}$ to enable RF filtering of any residual amplitude modulation at $F_{PDH}$ (generated as an unused by-product of the PDH phase modulation process) in the stabilisation feedback loop, using a low-pass filter (LPF) 916A for each laser 102A. The converted light from the MZI 114 is demultiplexed by the DeMux 128, and detected by a corresponding photodetector 918A. Each photodetector signal is low-pass filtered by the LPF 916A to remove the residual amplitude modulation at $F_{PDH}$. The filtered signal is then used as the stabilisation feedback signal for the frequency noise stabilisation in each individual laser 102A via phase measurement and feedback in each corresponding servo 914A. Each servo 914A includes digital or analogue electronics equivalent to the phase meter 138A and the servo controller 148A.

Independent tuning of each laser using a further feedback and control loop, such as the PDH loop described above, allows the laser to follow slow drift in the optical wavelength of its corresponding sensor (e.g. the FFPI sensor 902A). The further feedback and control loop, such as the PDH loop, may be at a lower frequency (e.g. below 1 Hz) than a signal bandwidth related to the sensor (which, for example, may be less than 500 Hz for an accelerometer), thereby providing an "open loop" measurement of strain; alternatively, the bandwidth of the further feedback and control loop may be higher (e.g. greater than 500 Hz for the accelerometer) than the signal bandwidth, thereby providing a "closed loop" measurement of strain. (The stabilisation loop operates at a higher bandwidth, e.g. with a unity gain at about 30 kHz). Having the further feedback and control loop operating at a frequency higher than the required signal bandwidth may increase dynamic range and linearity, and reduce distortion. Many lasers can be multiplexed onto the same frequency reference using standard multiplexing equipment, e.g. using an arrayed waveguide grating (AWG), or a thin film filter device.

In combination with array technology, the system may be cheaper, lighter, less bulky, longer range and more corrosion resistant than existing electronic technologies used in ocean environments. This system may allow very sensitive detection of acoustic and sub-sonic signals (geoseismic) down to a few Hertz by reducing laser frequency noise.

In some embodiments, the frequency shift in one arm of the MZI 114 is provided by an optical modulator other than the AOM 122: for example, other types of phase or frequency modulators such as an electrooptic modulator.

In some embodiments, the long arm 118 of the MZI 114 is formed by an optical fibre, wound on a metal spool with a diameter typically between 30 mm and 200 mm; this diameter is chosen so that the spool is relatively compact but yet without excessive induced bend loss in the wound fibre. The metal spool also increases the thermal mass of the long arm to suppress and/or dampen effects of environmental temperature variations on the interferometer 114. Furthermore, stiffness of the spool makes the fibre less susceptible to acousto-mechanical vibrations in the environment. The interferometer 114 is isolated mechanically and acoustically from the surrounding environment. For example, the MZI 114 is placed in a thick-walled metal box, lined with lead foam, and placed on mechanically isolating legs.

In some embodiments, software-controlled Field Programmable Gate Arrays (FPGA) incorporating RF digital mixers and phase detection are used for phase extraction. Digital analysis and control of the clock 144, of the phase meters 138 and of the servo controllers 148 allow the lasers 102 to be independently tuned by injecting a digital tuning signal into the digital control loop for each laser (i.e. the offset 141 is digital). The digital nature of the system allows for simple scaling in the number of sensors as well as convenient and quick software changing of gain and bandwidth variables in the feedback loop.

Many modifications will be apparent to those skilled in the art without departing from the scope of the present invention as herein described with reference to the accompanying drawings and defined in the claims.

The invention claimed is:

1. A method for stabilising a plurality of output frequencies of a corresponding plurality of laser beams, having different central frequencies, including:
   directing the plurality of laser beams into an optical frequency to radio-frequency phase converter that defines a shared frequency reference, wherein the optical frequency to radio-frequency phase converter is a Mach-Zehnder Interferometer (MZI) with an arm length mismatch, and the shared frequency reference is defined by a value of the arm length mismatch;
   generating, using the MZI, a plurality of optical output signals corresponding to the plurality of laser beams and representative of frequency fluctuations between the respective central frequencies and the shared frequency reference;
   generating a plurality of electrical output signals, corresponding to the plurality of laser beams, using the plurality of optical signals;
   determining a plurality of radio-frequency phases corresponding to the plurality of electrical output signals;
   generating from the determined plurality of radio-frequency phases a corresponding plurality of feedback signals indicative of the respective frequency fluctuations;
   directing the plurality of feedback signals to a corresponding plurality of wavelength controllers of the laser beams to reduce the frequency fluctuations of the laser beams;
   modulating a portion of each laser beam in an arm of the MZI, based on a modulation signal, to generate a modulation in each optical output signal; and
   demodulating each electrical output signal to determine the radio-frequency phase of each electrical output signal.

2. A method as claimed in claim 1, wherein the modulation in each optical output signal is an amplitude modulation.

3. A method as claimed in claim 1, wherein modulating of the portion of each laser beam is performed using an acousto-optic modulator.

4. A method as claimed in claim 3, wherein the modulator has a modulation frequency less than or equal to about 200 MHz.

5. A method as claimed in claim 1, wherein the demodulating of each electrical output signal includes using a demodulation signal based on the modulation signal.

6. A method as claimed in claim 5, wherein the demodulating of each electrical output signal includes mixing each electrical output signal with a local oscillator signal associated with the modulation signal.

7. A method as claimed in claim 1, wherein the generating of the plurality of feedback signals includes using a corresponding plurality of independently variable offset signals for independently tuning the central frequencies of the laser beams.

8. A method as claimed in claim 1, wherein the directing of the plurality of laser beams includes directing using an optical multiplexer.

9. A method as claimed in claim 1, including demultiplexing the plurality of optical output signals before the generating of the plurality of electrical output signals.

10. A method as claimed in claim 1, wherein the plurality of electrical output signals includes digital signals.

11. A method as claimed in claim 1, wherein the generating of the plurality of feedback signals includes using a plurality of feedback filters having respective defined bandwidths.

12. A method as claimed in claim 11, wherein each of the plurality of feedback filters has a gain and bandwidth defined by one or more proportional-integrator units.

13. A method as claimed in claim 12, wherein bandwidth of each of the plurality of feedback filters, includes frequencies greater than zero MHz and less than about 1 MHz.

14. A method as claimed in claim 1, wherein a periodicity of frequency variation in the MZI is at least four times greater than a free-running linewidth of each laser beam.

15. A method as claimed in claim 1, wherein the plurality of laser beams are generated using diode lasers.

16. Optical and electronic circuitry configured to perform a method as claimed in claim 1.

17. A system for stabilising a plurality of output frequencies of a corresponding plurality of laser beams, having different central frequencies, including:
an optical frequency to radio-frequency phase converter that defines a shared frequency reference, for generating a plurality of optical output signals corresponding to the plurality of laser beams and representative of frequency fluctuations between the respective central frequencies and the shared frequency reference, wherein the optical frequency to radio-frequency phase converter is a Mach-Zehnder Interferometer (MZI) with an arm length mismatch, and the shared frequency reference is defined by a value of the arm length mismatch;
a plurality of photodetectors for generating a plurality of electrical output signals, corresponding to the plurality of laser beams, using the plurality of optical signals;
a plurality of phase-responsive devices for generating, from a plurality of radio-frequency phases of the electrical output signals, a corresponding plurality of feedback signals indicative of the respective frequency fluctuations; and
a plurality of feedback circuits for directing the plurality of feedback signals to a corresponding plurality of wavelength controllers of the laser beams to reduce the frequency fluctuations of the laser beams,
the MZI including a modulator for modulating a portion of each laser beam in an arm of the MZI, based on a modulation signal, to generate a modulation in each optical output signal, and each phase-responsive device including a demodulator for demodulating each electrical output signal to determine the radio-frequency phase of each electrical output signal.

18. A system as claimed in claim 7, wherein the modulation in each optical output signal is an amplitude modulation.

19. A system as claimed in claim 17, wherein the modulator is an acousto-optic modulator.

20. A system as claimed in claim 19, wherein the modulator has a modulation frequency less than or equal to about 200 MHz.

21. A system as claimed in claim 17, wherein the demodulator uses a demodulation signal based on the modulation signal.

22. A system as claimed in claim 21, wherein each phase-responsive device includes a mixer for mixing each electrical output signal with a local oscillator signal associated with the modulation signal.

23. A system as claimed in claim 17, wherein each phase-responsive device uses a corresponding independently variable offset signal for independently tuning the central frequency of the corresponding laser beam.

24. A system as claimed in claim 17, including an optical multiplexer for directing the plurality of laser beams into the MZI.

25. A system as claimed in claim 17, including a demultiplexer for demultiplexing the plurality of optical output signals before the generating of the plurality of electrical output signals.

26. A system as claimed in claim 17, wherein the plurality of electrical output signals includes digital signals.

27. A system as claimed in claim 17, including a plurality of feedback filters having respective defined bandwidths for generating the plurality of feedback signals.

28. A system as claimed in claim 27, wherein each of the plurality of feedback filters includes one or more proportional-integrator units for defining its gain and bandwidth.

29. A system as claimed in claim 28, wherein bandwidth of each of the plurality of feedback filters, includes frequencies greater than zero MHz and less than about 1 MHz.

30. A system as claimed in claim 17, wherein a periodicity of frequency variation in the MZI is at least four times greater than a free-running linewidth of each laser beam.

31. A system as claimed in claim 17, including a plurality of diode lasers for generating the plurality of laser beams.

32. A system for frequency stabilisation of a plurality of laser beams, including:
an optical-frequency-to-radio-frequency-phase converter, that defines a shared frequency reference, for generating a plurality of radio-frequency (RF) signals representative of frequency fluctuations of the respective laser beams, wherein the optical-frequency-to-radio-frequency phase converter is a Mach-Zehnder Interferometer (MZI) with an arm length mismatch, and the shared frequency reference is defined by a value of the arm length mismatch;
a corresponding plurality of phase-responsive devices for generating phase signals from the RF signals; and
a corresponding plurality of feedback loops for controlling the respective frequencies of the laser beams, using the phase signals, to reduce the frequency fluctuations,
the MZI including a modulator for modulating a portion of each laser beam in an arm of the MZI, based on a modulation signal, to generate the RF signals, and each phase-responsive device including a demodulator for demodulating each RF signal to generate each phase signal.

33. A method for frequency stabilisation of a plurality of laser beams, including:

generating a corresponding plurality of radio-frequency (RF) signals representative of frequency fluctuations in the respective laser beams using a shared frequency reference defined by a Mach-Zehnder Interferometer (MZI) with an arm length mismatch, wherein and the shared frequency reference is defined by a value of the arm length mismatch, generating a corresponding plurality of phase signals from the RF signals;

controlling the respective frequencies of the laser beams, using the phase signals, to reduce the frequency fluctuations;

modulating a portion of each laser beam in an arm of the MZI, based on a modulation signal, to generate the RF signals; and demodulating each RF signal to generate each phase signal.

* * * * *

UNITED STATES PATENT AND TRADEMARK OFFICE
CERTIFICATE OF CORRECTION

PATENT NO. : 8,693,867 B2
APPLICATION NO. : 12/990621
DATED : April 8, 2014
INVENTOR(S) : Ian C. M. Littler et al.

It is certified that error appears in the above-identified patent and that said Letters Patent is hereby corrected as shown below:

In the Claims:

In Column 14, Claim 18, line 3, delete "7" an insert --17--.

Signed and Sealed this
Fifteenth Day of July, 2014

Michelle K. Lee
*Deputy Director of the United States Patent and Trademark Office*

UNITED STATES PATENT AND TRADEMARK OFFICE
CERTIFICATE OF CORRECTION

PATENT NO.         : 8,693,867 B2
APPLICATION NO. : 12/990621
DATED              : April 8, 2014
INVENTOR(S)        : Littler et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 435 days.

Signed and Sealed this

Twenty-ninth Day of September, 2015

Michelle K. Lee
*Director of the United States Patent and Trademark Office*